(12) United States Patent
Chen et al.

(10) Patent No.: US 10,027,316 B2
(45) Date of Patent: Jul. 17, 2018

(54) LOW POWER CLOCK BUFFER CIRCUIT FOR INTEGRATED CIRCUIT WITH MULTI-VOLTAGE DESIGN

(71) Applicant: MediaTek Inc., Hsin-Chu (TW)

(72) Inventors: Yi-Feng Chen, Xinpu Township, Hsinchu County (TW); Ya-Shih Huang, Yilan (TW); Chun-Sheng Huang, Hsinchu (TW); Yiwei Chen, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/243,237

(22) Filed: Aug. 22, 2016

(65) Prior Publication Data

US 2017/0063358 A1    Mar. 2, 2017

Related U.S. Application Data

(60) Provisional application No. 62/208,910, filed on Aug. 24, 2015.

(51) Int. Cl.
| | | |
|---|---|---|
| *H03K 5/15* | (2006.01) | |
| *H03K 5/135* | (2006.01) | |
| *H03K 5/00* | (2006.01) | |

(52) U.S. Cl.
CPC .............. *H03K 5/15* (2013.01); *H03K 5/135* (2013.01); *H03K 2005/00019* (2013.01)

(58) Field of Classification Search
CPC ................ H03K 5/15; H03K 5/135; H03K 2005/00019; H03K 5/1508
See application file for complete search history.

(56) References Cited

U.S. PATENT DOCUMENTS

| | | | |
|---|---|---|---|
| 6,335,885 B1* | 1/2002 | Shimizu ............... | G11C 5/143 365/194 |
| 6,877,060 B2 | 4/2005 | Hunsaker | |
| 9,477,258 B2* | 10/2016 | Nieh ..................... | G06F 1/10 |
| 2011/0121875 A1 | 5/2011 | Lung et al. | |

OTHER PUBLICATIONS

Lung, C.L., et al.; "Clock Skew Optimization Considering Complicated Power Modes;" EDAA; 2010; pp. 1-6.
Tu W.P., et al.; "Low-Power Timing Closure Methodology for Ultra-Low Voltage Designs;" IEEE; 2013; pp. 697-704.

* cited by examiner

*Primary Examiner* — Jung Kim
(74) *Attorney, Agent, or Firm* — McClure, Qualey & Rodack, LLP

(57) ABSTRACT

A clock buffer circuit is provided. The clock buffer circuit receives an input clock signal and generates a delay clock signal. The clock buffer circuit includes an input circuit, an output circuit, a first delay path, and a second delay path. The input circuit receives the input clock signal and generates an output clock signal according to the input clock signal. The output circuit generates the delay clock signal. The first delay path is coupled between the input circuit and the output circuit. The second delay path is coupled between the input circuit and the output circuit. The input circuit selectively provides the output clock signal to a first specific delay path among the first and second delay paths according to a control signal. The output circuit receives the output clock signal which passes through the first specific delay path and outputs the delay clock signal.

12 Claims, 15 Drawing Sheets

LOW POWER CLOCK BUFFER CIRCUIT FOR INTEGRATED CIRCUIT WITH MULTI-VOLTAGE DESIGN

CROSS REFERENCE TO RELATED APPLICATIONS

This application claims the benefit of U.S. Provisional Application No. 62/208,910, filed on Aug. 24, 2015, the contents of which are incorporated herein by reference.

BACKGROUND OF THE INVENTION

Field of the Invention

The invention relates to a clock buffer circuit, and, more particularly, to a power-mode-aware clock buffer circuit for an integrated circuit with multi-voltage design.

Description of the Related Art

In order to reduce power consumption, an integrated circuit with multi power modes is provided to provide different operation voltages for function modules. For example, the function module required to operate at full speed is provided with the maximum operation voltage. For an integrated circuit, the clock latency of one function module operating at one power mode is different from the clock latency of another function module operating at another power mode. Moreover, even though two function modules operate at the same power mode, the clock latency occurring in the two function modules is different due to characteristics of the element, the data transmission path, and so on. This difference in the clock latency may cause clock skew between the two function modules, which degrades system performance. Thus, a power-mode aware clock buffer circuit is required to eliminate clock skew.

BRIEF SUMMARY OF THE INVENTION

An exemplary embodiment of a clock buffer circuit is provided. The clock buffer circuit receives an input clock signal and generates a delay clock signal. The clock buffer circuit comprises an input circuit, an output circuit, a first delay path, and a second delay path. The input circuit receives the input clock signal and generates an output clock signal according to the input clock signal. The output circuit generates the delay clock signal derived from the output clock signal. The first delay path is coupled between the input circuit and the output circuit. The second delay path is coupled between the input circuit and the output circuit. The input circuit selectively provides the output clock signal to a first specific delay path among the first and second delay paths according to a control signal. The output circuit receives the output clock signal which passes through the first specific delay path and outputs the delay clock signal.

An exemplary embodiment of an integrated circuit is provided. The integrated circuit comprises a control circuit, a first function circuit, a first determination circuit, and a first controllable delay circuit. The control circuit generates a first operation voltage. The first function circuit is supplied by the first operation voltage and operates based on a first delay clock signal. The first determination circuit receives the first operation voltage and generates a first control signal according to the first operation voltage. The first controllable delay circuit receives an input clock signal to generate the first delay clock signal with a first variable delay time according to the first control signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the contemplated mode of carrying out the invention. This description is made for the purpose of illustrating the general principles of the invention and should not be taken in a limiting sense. The scope of the invention is best determined by reference to the appended claims.

Figure 1:
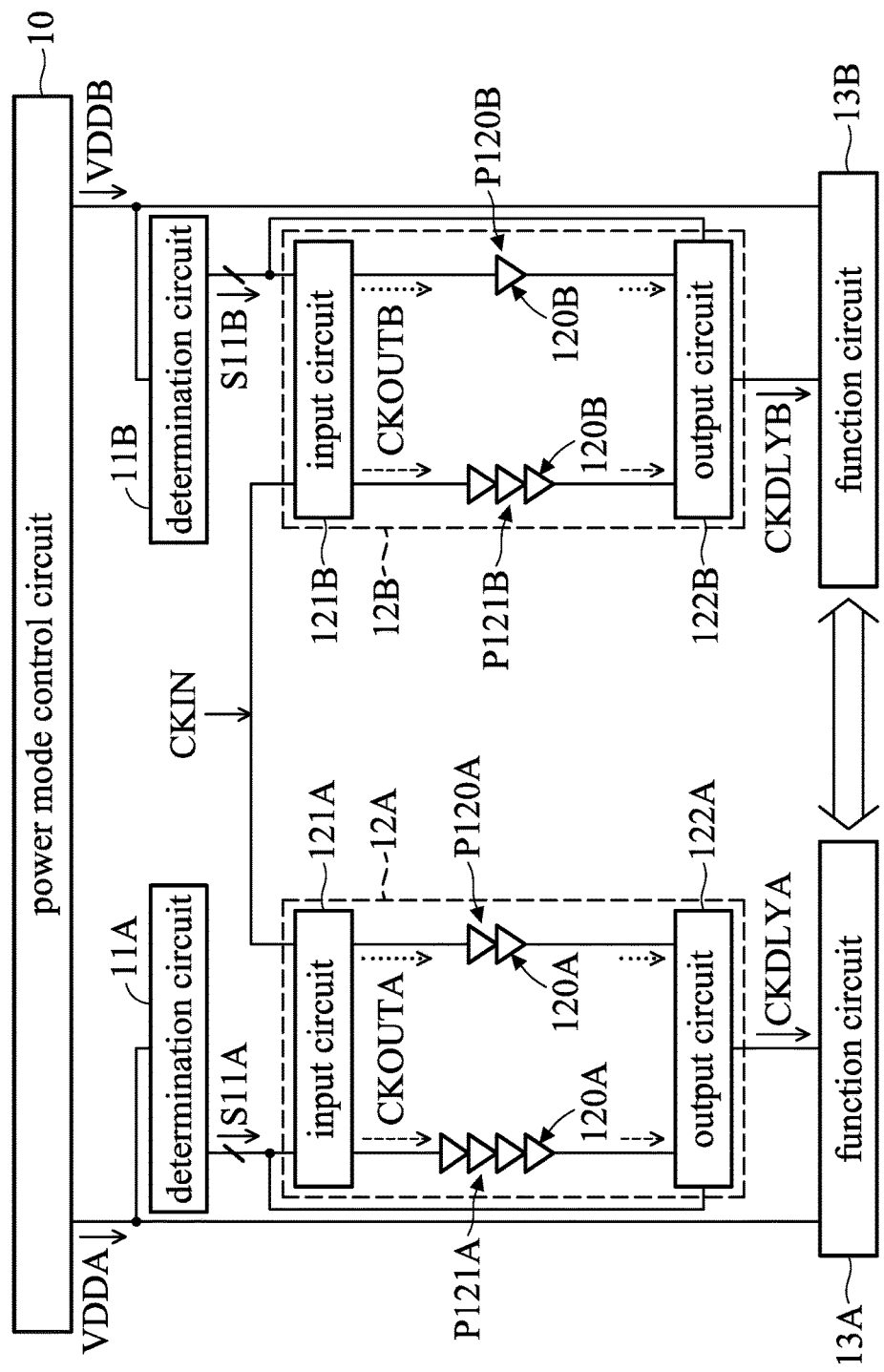
FIG. 1 shows one exemplary embodiment of an integrated circuit with multi-voltage design.

FIG. 1 is an integrated circuit with multi-voltage design. As shown in FIG. 1, the integrated circuit 1 comprises a power mode control circuit 10, a plurality of determination circuits 11, a plurality of clock buffer circuits 12, and a plurality of function circuits 13. The power mode control circuit 10 generates and provides voltages to the function circuits 13 to serve as their operation voltages. In the embodiment, one function circuit 13 corresponds to one determination circuit 11 and one clock buffer circuit 12. In other words, each of the number of determination circuits 11 and the number of clock buffer circuits 12 is equal to the number of function circuits 13. In the embodiment, two determination circuits 11A and 11B, two clock buffer circuits 12A and 12B, and two function circuits 13A and 13B are taken as an example for illustration. The power mode control circuit 10 generates two voltages VDDA and VDDB to the function modules 13A and 13B to serve as the operation voltages of the function modules 13A and 13B, respectively. There is data transmission between the function modules 13A and 13B.

For each clock buffer circuit, there are at least two delay paths for a clock signal CKIN. The delay paths in each clock buffer circuit have different delay times. For example, the clock buffer circuit 12A comprises two delay paths P120A and P121A. By arranging different numbers of buffers 120A coupled in series, the delay time of the delay path P120A is different from the delay time of the delay path P121A. In the embodiment, the delay time of the delay path P121A with more buffers 120A is longer than the delay time of the delay path P120A with fewer buffers 120A. In FIG. 1, the delay path P120A comprises two buffers 120A, while the delay path P121A comprises four buffers 120A. The delay time of the delay path P121B is also longer than the delay time of the delay path P120B. In the embodiment, the number of buffers 120B of the delay path P120B may be equal to or different from the number of buffers 120A of the delay path P120A, while the number of buffers 120B of the delay path P121B may be equal to or different from the number of buffers 120A of the delay path P121A. In the embodiment of FIG. 1, the delay path P120B comprises one buffer 120B, while the delay path P121B comprises three buffers 120B. In the embodiment, for each of the clock buffer circuits 12A and 12B, since there are at least two delay paths, the clock buffer circuit has a variable delay time for generating a corresponding delay clock signal.

In the following description, the clock buffer circuit 12A is given as an example. Both of the delay paths P120A and P121A are coupled between an input circuit 121A and an output circuit 122A. The input circuit 121A receives the input clock signal CKIN and generates an output clock signal CKOUTA according to the input clock signal CKIN. In the embodiment, the input circuit 121A may directly output the input clock signal CKIN to serve as the output clock signal CKOUTA or generate the output clock signal CKOUTA whose timing is synchronized with the timing of the input clock signal CKIN. Each of the input circuit 121A and the output circuit 122A is controlled by a control signal S11A. The determination circuit 11A receives the voltage VDDA from the power mode control circuit 10 and generates the control signal S11A according to the voltage VDDA. The input circuit 121A is controlled by the control signal S11A to selectively provide the output clock signal CKOUTA to one specific delay path among the delay paths P120A and P121A, such as the delay path P121A, as indicated by the left dot-line arrow. Accordingly, the output circuit 122A receives the output clock signal CKOUTA passing through the specific delay path (delay path P120A) and outputs the clock signal delayed by the specific delay path (referred to as "delay clock signal CKDLYA") to the function circuit 13A. The function circuit 13A operates based on the delay clock signal CKDLYA. At this time, according to the control signal S11A, the input circuit 121A blocks the input clock signal CKIN or any clock signal derived from the input clock signal CKIN (such as the output clock signal CKOUTA) from being provided to another specific delay path among the delay paths P120A and P121A, which is different from the above specific delay path through which the output clock signal CKOUTA passes, that is the other delay path P121A. In this embodiment, the determination circuit 11B and the clock buffer circuit 12B may perform similar operations.

According to the embodiment above, for each clock buffer circuit, the delay path which is configured to delay the output clock signal is determined or selected according to the voltage supplied to the corresponding function circuit. During the operation of each buffer circuit, one delay path receives the output clock signal and operates to delay the output clock signal. The other delay path(s) does not receive any clock signal and furthermore does not perform the clock delay. Thus, the power consumed by each buffer circuit during the operation can be reduced.

Figure 2:
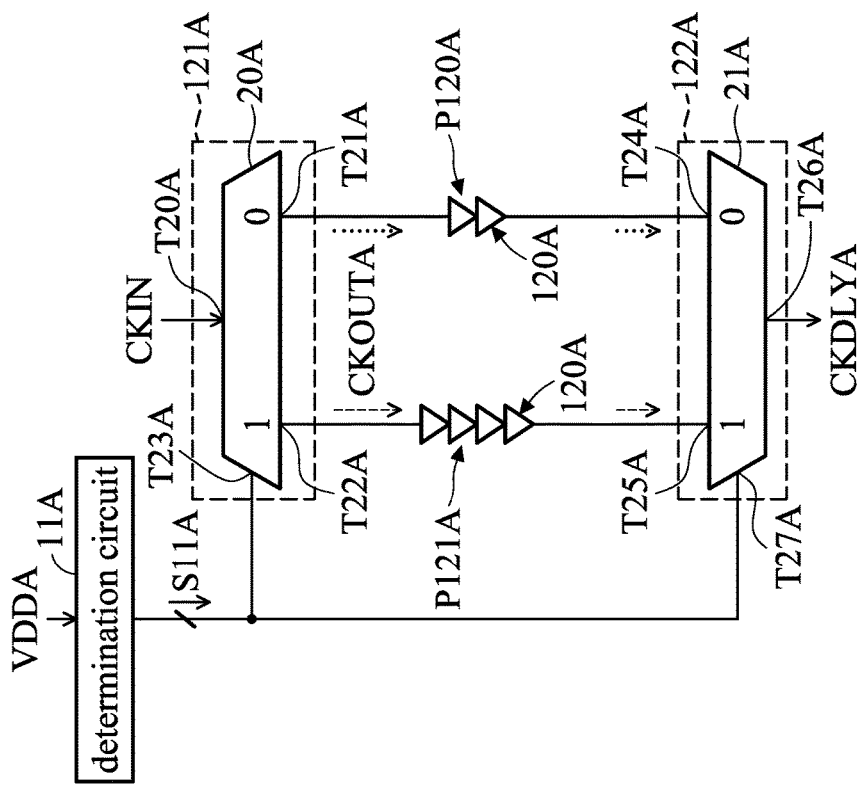
FIG. 2 shows one exemplary embodiment of clock buffer circuits.

In the following description, details of the operation of the integrated circuit 1 will be described by taking as an example of the set of the determination circuit 11A, the clock buffer circuit 12A, and the function circuit 13A, as shown in FIG. 2.

Referring to FIG. 2, the input circuit 121A comprises a demultiplexer 20A. The demultiplexer 20A has an input terminal T20A receiving the input clock signal CKIN and two output terminals T21A and T22A respectively coupled to the delay paths P120A and P121A. The demultiplexer 20A also has a control terminal T23A receiving the control signal S11A. The output circuit 122A comprises a multiplexer 21A. The multiplexer 21A has two input terminals T24A and T25A respectively coupled to the delay paths P120A and P121A and an output terminal T26A coupled to the function circuit 13A. The multiplexer 21A also has a control terminal T27A receiving the control signal S11A. Each of the delay paths P120A and P121A is formed by at least one buffer coupled in series. With more buffers, the delay time of the corresponding delay path is longer. In the embodiment, the number of buffers 120A of the delay path P121A is greater than the number of buffers 120A of the delay path P120A. Thus, the delay time of the delay path P121A is longer than the delay time of the delay path P120A.

The determination circuit 11A receives the voltage VDDA from the power mode control circuit 10 and generates a control signal S11A according to the voltage VDDA. In the embodiment, the determination circuit 11A may detect the value of the voltage VDDA and generate the control signal S11A with a digital form according to the detection result. The control signal S11A is used to indicate that the voltage VDDA is at a relatively high level or a relatively low level. When the voltage VDDA is at a relatively high level, the determination circuit 20 generates the control signal S11A with the logic value "1". The demultiplexer 20A is controlled by the control signal S11A to transmit the input clock signal CKIN from the input terminal T20A to the output terminal T22A to serve as the output clock signal CKOUTA. The output clock signal CKOUTA is delayed by the delay path P121A and then transmitted to the input terminal T25A of the multiplexer 21A. At this time, the demultiplexer 20A does not transmit the input clock signal CKIN or any clock signal derived from the input clock signal CKIN to the delay path P120A through the output terminal T21A. The multiplexer 21A is controlled by the control signal S11A to transmit the output clock signal CKOUTA, which passes through the delay path P121A, from the input terminal T25A to the output terminal T26A to serve as the delay clock signal CKDLYA. Accordingly, the function circuit 13A receives the delay clock signal CKDLYA and operates based on the delay clock signal CKDLYA.

For example, when the voltage VDDA is at a relatively low level, determination circuit 20 generates the control signal S11A with the logic value "0". The demultiplexer 20A is controlled by the control signal S11A to transmit the input clock signal CKIN from the input terminal T20A to the output terminal T21A to serve as the output clock signal CKOUTA. The output clock signal CKOUTA is delayed by the delay path P120A and then transmitted to the input terminal T24A of the multiplexer 21A. At this time, the demultiplexer 20A does not transmit the input clock signal CKIN or any clock signal derived from the input clock signal CKIN to the delay path P121A through the output terminal T22A. The multiplexer 21A is controlled by the control signal S11A to transmit the output clock signal CKOUTA, which passes through the delay path P120A, from the input terminal T24A to the output terminal T26A to serve as the delay clock signal CKDLYA. Accordingly, the function circuit 13A receives the delay clock signal CKDLYA and operates based on the delay clock signal CKDLYA.

The clock buffer circuit 12B has a similar structure as the clock buffer circuit 12A. The determination circuit 11B and the clock buffer circuit 12B perform a similar operation as the determination circuit 11A and the clock buffer circuit 12A. Thus, the detailed description is omitted here.

Figure 3A:
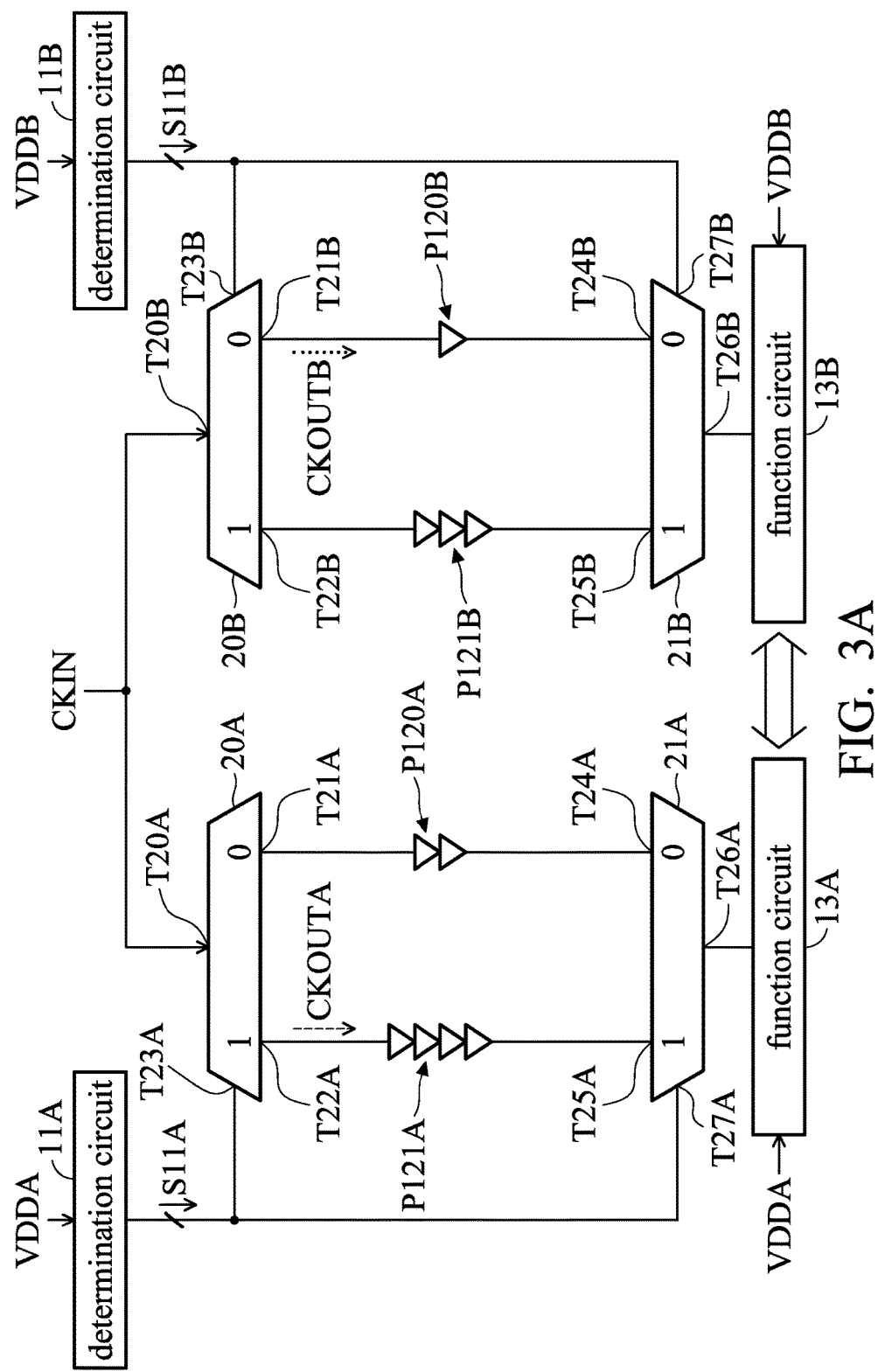
FIGS. 3A-3D are schematic diagrams illustrating operations of clock buffer circuits of FIG. 2.

According to the operations of the determination circuits 11A and 11B and the clock buffer circuits 12A and 12B, the timing variation in the data transmission between the function circuits 13A and 13B with different operation voltages can be decreased. In the first case, the power mode control circuit 10 may generate a voltage with a relatively high level to the function circuit 13A and a voltage with a relatively low level to the function circuit 13B. The function circuit 13A may operate at a high speed with less clock latency, while the function circuit 13B may operate at a low speed with greater clock latency. At this time, according to the operation of the demultiplexer 20A controlled by the control signal S11A with the logic value "1", the demultiplexer 20A transmits the input clock signal CKIN to the delay path P121A to serve as the output clock signal CKOUTA, and the output clock signal CKOUTA is delayed by the delay path P121A with the longer delay time. According to the operation of the demultiplexer 20B controlled by the control signal S11B with the logic value "0", while the demultiplexer 20B transmits the input clock signal CKIN to the delay path P120B to serve as the output clock signal CKOUTB and the output clock signal CKOUTB is delayed by the delay path P120B with the shorter delay time, as shown FIG. 3A. The multiplexer 21A is controlled by the control signal S11A to transmit the output clock signal CKOUTA, which is delayed by the delay path P121A, from the input terminal T25A to the output terminal T26A to serve as the delay clock signal CKDLYA. The multiplexer 21B is controlled by the control signal S11B to transmit the output clock signal CKOUTB, which is delayed by the delay path P120B, from the input terminal T24B to the output terminal T26B to serve as the delay clock signal CKDLYB.

Figure 3B:
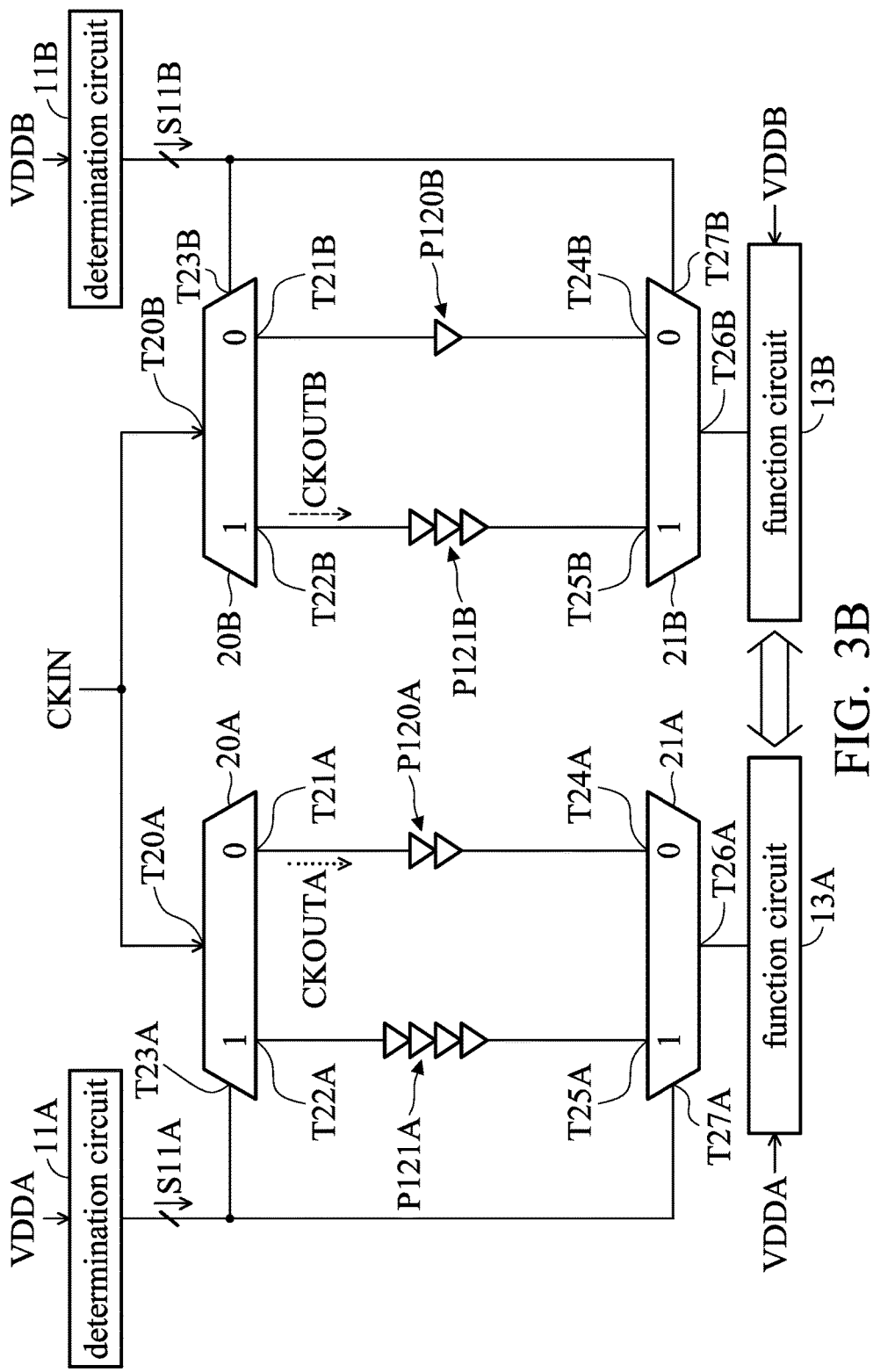

In second case, the power mode control circuit 10 may generate a voltage with a relatively low level to the function circuit 13A and a voltage with a relatively high level to the function circuit 13B. The function circuit 13A may operate at a low speed with greater clock latency, while the function circuit 13B may operate at a high speed with less clock latency. At this time, according to the operation of the demultiplexer 20A controlled by the control signal S11A with the logic value "0", the demultiplexer 20A transmits the input clock signal CKIN to the delay path P120A to serve as the output clock signal CKOUTA, and the output clock signal CKOUTA is delayed by the delay path P120A with the shorter delay time. According to the operation of the demultiplexer 20B controlled by the control signal S11B with the logic value "1", the demultiplexer 20B transmits the input clock signal CKIN to the delay path P121B to serve as the output clock signal CKOUTB, and the output clock signal CKOUTB is delayed by the delay path P121B with the longer delay time, as shown FIG. 3B. The multiplexer 21A is controlled by the control signal S11A to transmit the output clock signal CKOUTA, which is delayed by the delay path P120A, from the input terminal T24A to the output terminal T26A to serve as the delay clock signal CKDLYA. The multiplexer 21B is controlled by the control signal S11B to transmit the output clock signal CKOUTB, which is delayed by the delay path P121B, from the input terminal T25B to the output terminal T26B to serve as the delay clock signal CKDLYB.

Figure 3C:
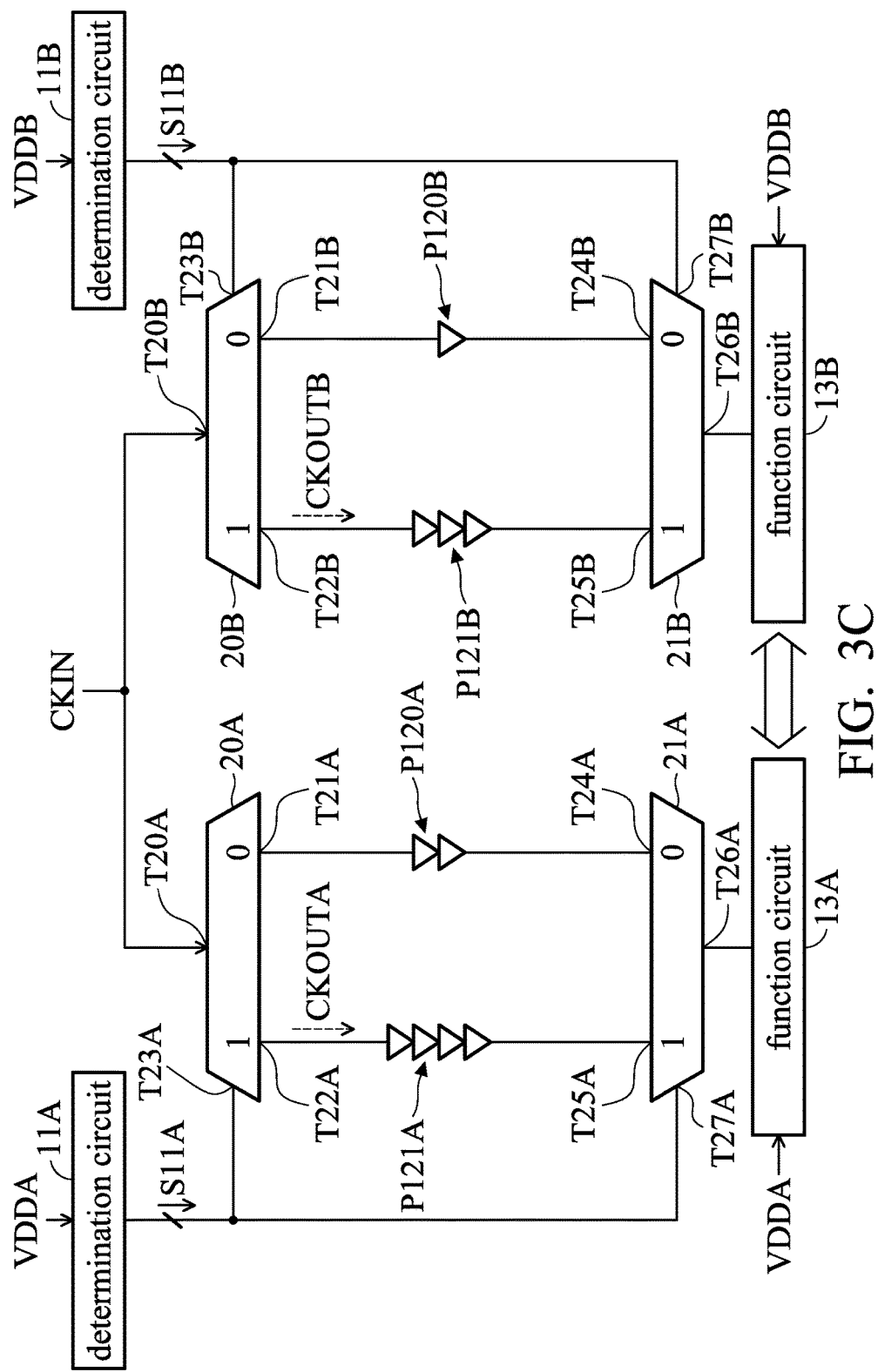

In the third case, the power mode control circuit 10 may generate a voltage with a relatively high level to the function circuit 13A and a voltage with a relatively high level to the function circuit 13B. The function circuit 13A may operate at a high speed with less clock latency, while the function circuit 13B may operate at a high speed with less clock latency. At this time, according to the operation of the demultiplexer 20A controlled by the control signal S11A with the logic value "1", the demultiplexer 20A transmits the input clock signal CKIN to the delay path P121A to serve as the output clock signal CKOUTA, and the output clock signal CKOUTA is delayed by the delay path P121A with the longer delay time. According to the operation of the demultiplexer 20B controlled by the control signal S11B with the logic value "1", while the demultiplexer 20B transmits the input clock signal CKIN to the delay path P121B to serve as the output clock signal CKOUTB, and the output clock signal CKOUTB is delayed by the delay path P121B with the longer delay time, as shown FIG. 3C. The multiplexer 21A is controlled by the control signal S11A to transmit the output clock signal CKOUTA, which is delayed by the delay path P121A, from the input terminal T25A to the output terminal T26A to serve as the delay clock signal CKDLYA. The multiplexer 21B is controlled by the control signal S11B to transmit the output clock signal CKOUTB, which is delayed by the delay path P121B, from the input terminal T25B to the output terminal T26B to serve as the delay clock signal CKDLYB.

Figure 3D:
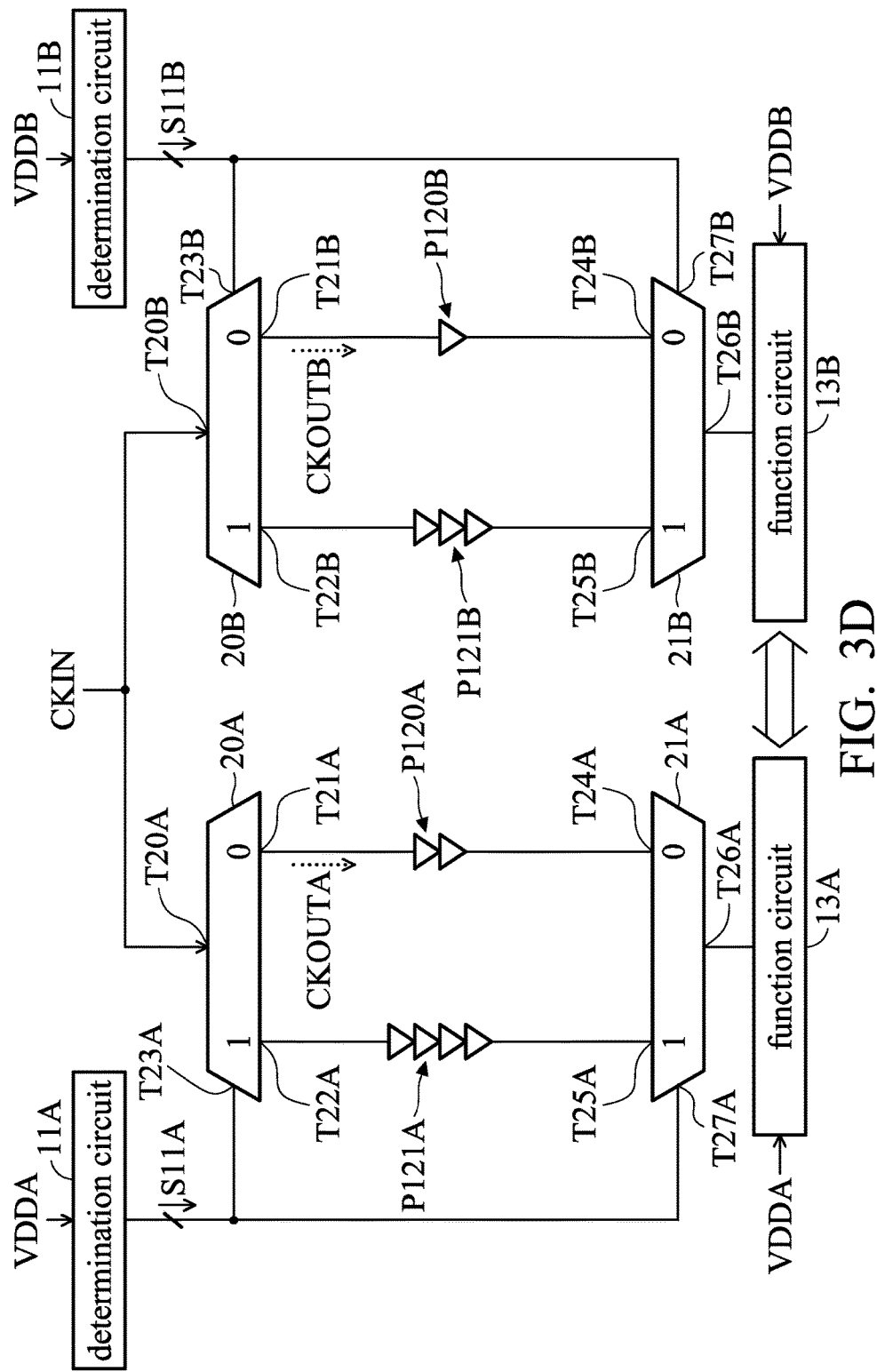

In fourth case, the power mode control circuit 10 may generate a voltage with a relatively low level to the function circuit 13A and a voltage with a relatively low level to the function circuit 13B. The function circuit 13A may operate at a low speed with greater clock latency, while the function circuit 13B may operate at a low speed with greater clock latency. At this time, according to the operation of the demultiplexer 20A controlled by the control signal S11A with the logic value "0", the demultiplexer 20A transmits the input clock signal CKIN to the delay path P120A to serve as the output clock signal CKOUTA, and the output clock signal CKOUTA is delayed by the delay path P120A with the shorter delay time. According to the operation of the demultiplexer 20B controlled by the control signal S11B with the logic value "0", the demultiplexer 20B transmits the input clock signal CKIN to the delay path P120B to serve as the output clock signal CKOUTB, and the output clock signal CKOUTB is delayed by the delay path P120B with the shorter delay time, as shown FIG. 3D. The multiplexer 21A is controlled by the control signal S11A to transmit the output clock signal CKOUTA, which is delayed by the delay path P120A, from the input terminal T24A to the output terminal T26A to serve as the delay clock signal CKDLYA. The multiplexer 21B is controlled by the control signal S11B to transmit the output clock signal CKOUTB, which is delayed by the delay path P120B, from the input terminal T24B to the output terminal T26B to serve as the delay clock signal CKDLYB.

According to the above embodiments, through the respective delay paths in the clock buffer circuits 12A and 12B, the clock latency of the function circuits 13A and 13B is compensated for. The clock skew between the function circuits 13A and 13B is lessened or eliminated. Moreover, during the operation of each buffer circuit, one delay path receives the output clock signal and operates to delay the received output clock signal. The other delay path(s) does not receive any clock signal for clock delay. Thus, the power consumed by each buffer circuit during the operation can be reduced.

Figure 4:
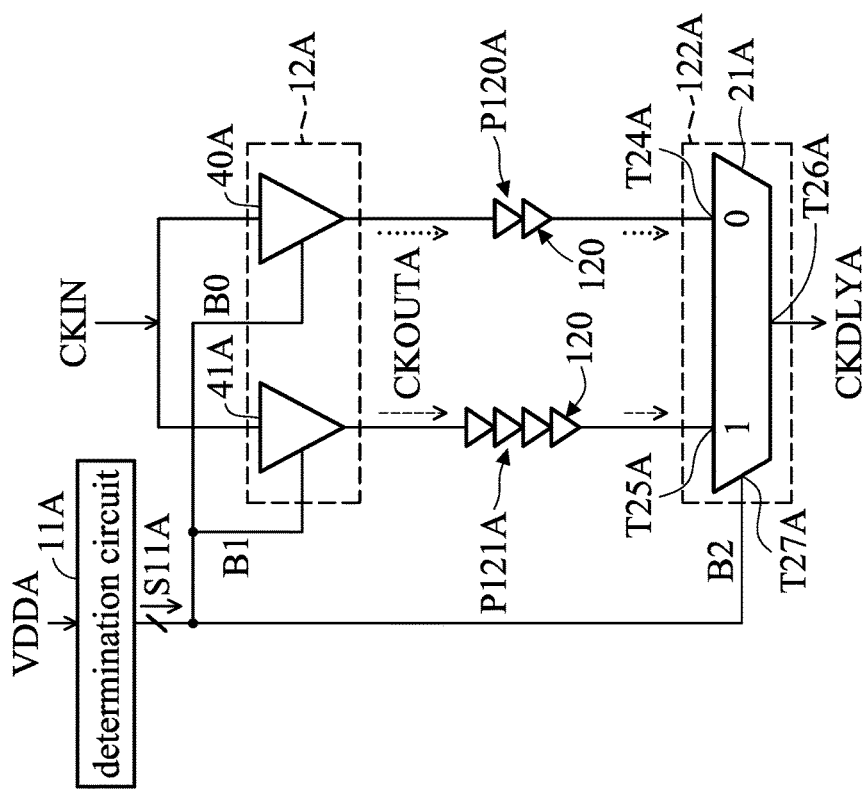
FIG. 4 shows another exemplary embodiment of clock buffer circuits.

In another embodiment, each of the input circuits 121A and 121B may comprise clock gating cells. Each of the control signals S11A and S11B is a digital signal with bits. The number of clock gating cells is equal to the number of delay paths. In the following description, the input circuit 121A is given as an example for illustration. Referring to FIG. 4, the input circuit 121A comprises two clock gating cells 40A and 41A. Each of the clock gating cells 40A and 41A receives the input clock signal CKIN and the control signal S11A. When the voltage VDDA is at a relatively high level, the determination circuit 20 generates the control signal S11A to enable the clock gating cell 41A to generate the output clock signal CKOUTA whose timing is synchronized with the timing of the input clock signal CKIN. The output clock signal CKOUTA is delayed by the delay path P121A and then transmitted to the input terminal T25A of the multiplexer 21A. At this time, the clock gating cell 40A is disabled according to the control signal S11A. That is, the clock gating cell 40A does not generate the output clock signal CKOUTA or any clock signal derived from the input clock signal CKIN to the delay path P120A. The multiplexer 21A is controlled by the control signal S11A to transmit the output clock signal CKOUTA, which passes through the delay path P121A, from the input terminal T25A to the output terminal T26A to serve as the delay clock signal CKDLYA. When the voltage VDDA is at a relatively low level, determination circuit 20 generates the control signal S11A to enable the clock gating cell 40A to generate the output clock signal CKOUTA whose timing is synchronized with the timing of the input clock signal CKIN. The output clock signal CKOUTA is delayed by the delay path P120A and then transmitted to the input terminal T24A of the multiplexer 21A. At this time, the clock gating cell 41A is disabled according to the control signal S11A. That is, the clock gating cell 41A does not generate the output clock signal CKOUTA or any clock signal derived from the input clock signal CKIN to the delay path P121A. The multiplexer 21A is controlled by the control signal S11A to transmit the output clock signal CKOUTA, which passes through the delay path P120A, from the input terminal T24A to the output terminal T26A to serve as the delay clock signal CKDLYA. The input circuit 121B has a similar structure as the input circuit 121A. The input circuit 121B performs a similar operation as the input circuit 121A. Thus, the detailed description is omitted here.

Figure 5:
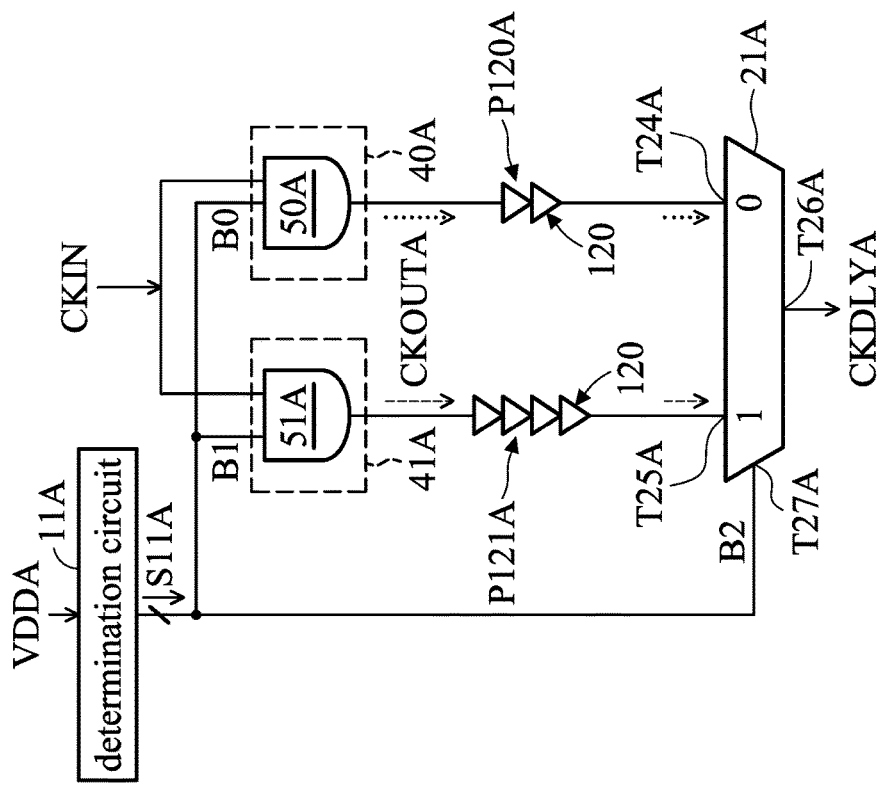
FIG. 5 shows another exemplary embodiment of clock buffer circuits.

In another embodiment, each of the control signals S11A and S11B is a digital signal with bits. In the embodiment of FIG. 4, each control signal is a digital signal with 3 bits "B0B1B2". The clock gating cells 40A and 41A are controlled by the two bits (such as B0 and B1) of the control signal S11A respectively. The multiplexer 21A is controlled by the bit B2 of the control signal S11A. As shown in FIG. 5, each of the clock gating cells 40A and 40B comprises an AND gate. The AND gate 50A receives the input clock signal CKIN and the bit B0 of the control signal S11A, while the AND gate 51A receives the input clock signal CKIN and the bit B1 of the control signal S11A. When one AND gate receives a bit with "1", the AND gate generates the output clock signal CKOUTA. That is, the corresponding clock gating cell is enabled. When one AND gate receives a bit with "0", the corresponding clock gating cell is disabled.

Figure 6A:
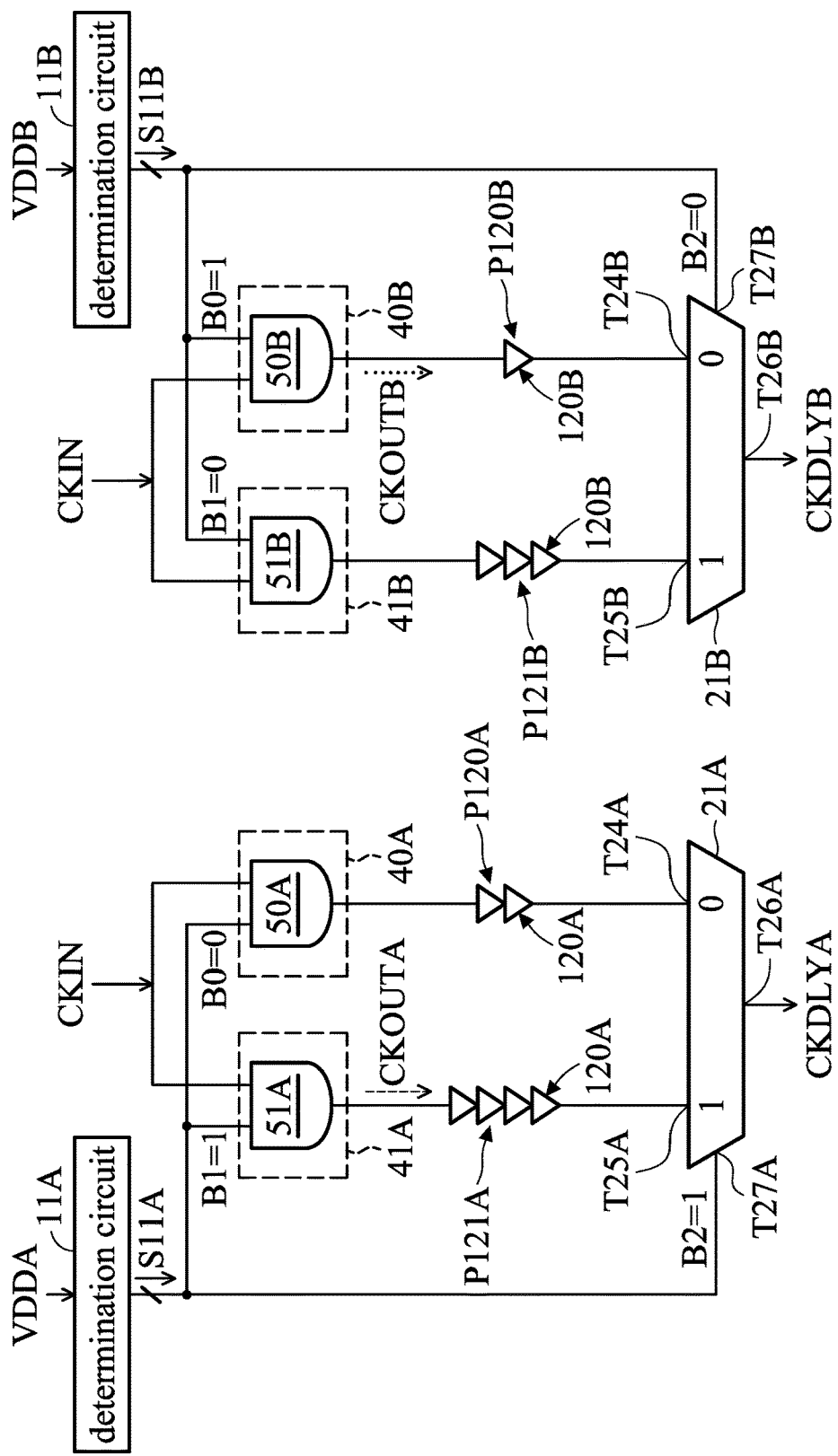
FIGS. 6A-6D are schematic diagrams illustrating operations of clock buffer circuits of FIG. 5.

According to the operations of the clock gating cells and the clock buffer circuits corresponding to the function circuits 13A and 13B, the timing variation in the data transmission between the function circuits 13A and 13B can be decreased. In the first case, the power mode control circuit 10 may generate a voltage with a relatively high level to the function circuit 13A and a voltage with a relatively low level to the function circuit 13B. The function circuit 13A may operate at a high speed with less clock latency, while the function circuit 13B may operate at a low speed with greater clock latency. Referring to FIG. 6A, at this time, the determination circuit 11A generates the control signal S11A with "011" (B0=0, B1=1, B2=1), while the determination circuit 11B generates the control signal S11B with "100" (B0=1, B1=0, B2=0). According to the operations of the clock gating cells 40A and 41A, the AND gate 51A generates the output clock signal CKOUTA to the delay path P121A (that is the clock gating cell 41A is enabled by the bit B1 of the control signal S11A) and the output clock signal CKOUTA is delayed by the delay path P121A with the longer delay time, while the AND gate 50A does not generate the output clock signal CKOUTA or any clock signal derived from the input clock signal CKIN (that is the clock gating cell 40A is disabled by the bit B0 of the control signal S11A), as shown in FIG. 6A. According to the operations of the clock gating cells 40B and 41B, the AND gate 50B generates the output clock signal CKOUTB to the delay path P120B (that is the clock gating cell 40B is enabled by the bit B0 of the control signal S11B) and the output clock signal CKOUTB is delayed by the delay path P120B with the shorter delay time, while the AND gate 51B does not generate the output clock signal CKOUTB or any clock signal derived from the input clock signal CKIN (that is the clock gating cell 41B is disabled by the bit B1 of the control signal S11B), as shown FIG. 6A. The multiplexer 21A is controlled by the bit B2 (B2=1) of the control signal S11A to transmit the output clock signal CKOUTA, which is delayed by the delay path P121A, from the input terminal T25A to the output terminal T26A to serve as the delay clock signal CKDLYA. The multiplexer 21B is controlled by the bit B2 (B2=0) of the control signal S11B to transmit the output clock signal CKOUTB, which is delayed by the delay path P120B, from the input terminal T24B to the output terminal T26B to serve as the delay clock signal CKDLYB.

Figure 6B:
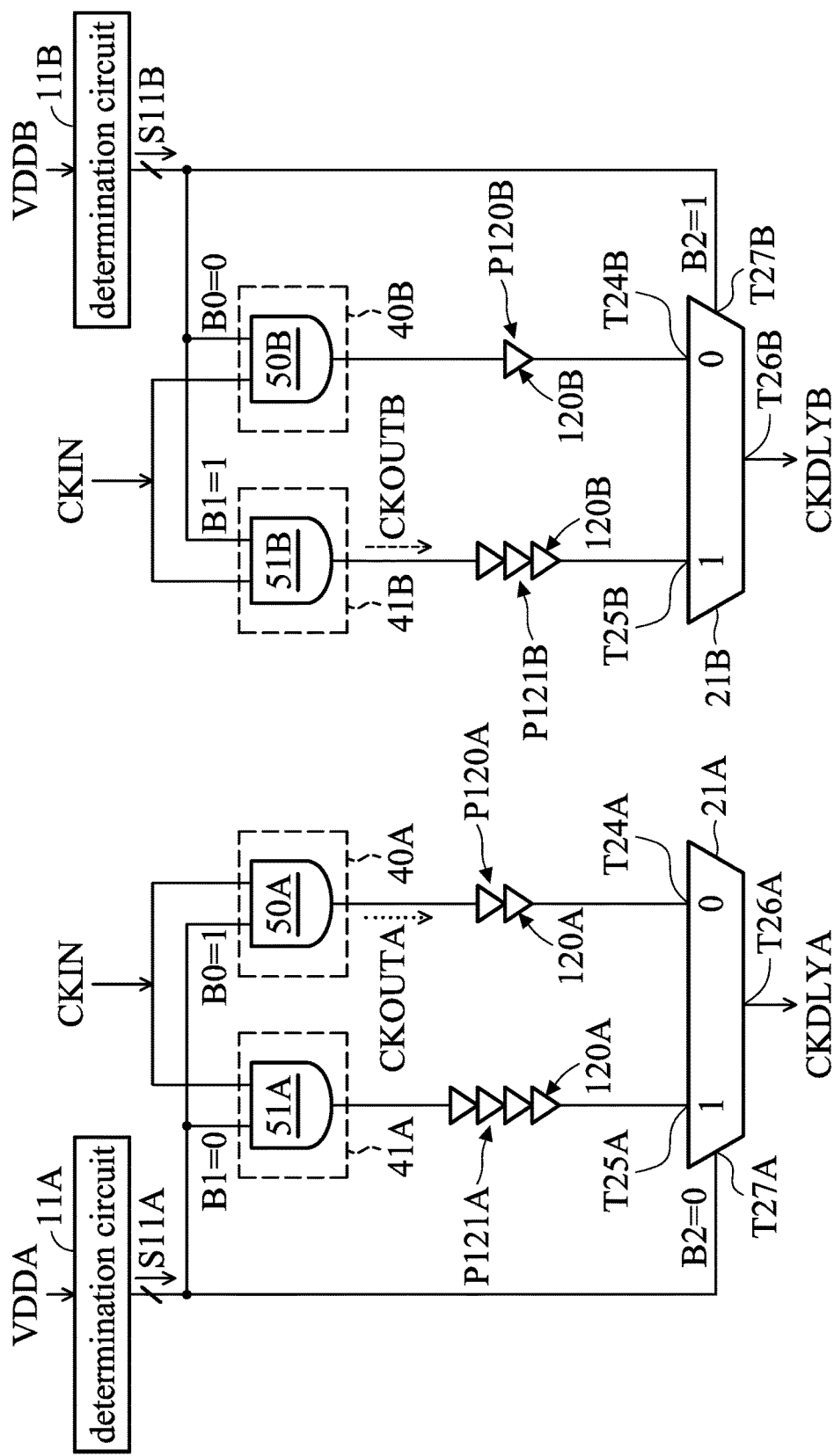

In second case, the power mode control circuit 10 may generate a voltage with a relatively low level to the function circuit 13A and a voltage with a relatively high level to the function circuit 13B. The function circuit 13A may operate at a low speed with greater clock latency, while the function circuit 13B may operate at a high speed with less clock latency. Referring to FIG. 6B, at this time, the determination circuit 11A generates the control signal S11A with "100" (B0=1, B1=0, B2=0), while the determination circuit 11B generates the control signal S11B with "011" (B0=0, B1=1, B2=1). According to the operations of the clock gating cells 40A and 41A, the AND gate 50A generates the output clock signal CKOUTA to the delay path P120A (that is the clock gating cell 40A is enabled by the bit B0 of the control signal S11A) and the output clock signal CKOUTA is delayed by the delay path P120A with the shorter delay time, while the AND gate 51A does not generate the output clock signal CKOUTA or any clock signal derived from the input clock signal CKIN (that is the clock gating cell 41A is disabled by the bit B1 of the control signal S11A), as shown in FIG. 6B. According to the operations of the clock gating cells 40B and 41B, the AND gate 51B generates the output clock signal CKOUTB to the delay path P121B (i.e. the clock gating cell 41B is enabled by the bit B1 of the control signal S11B) and the output clock signal CKOUTB is delayed by the delay path P121B with the longer delay time, while the AND gate 50B does not generate the output clock signal CKOUTB or any clock signal derived from the input clock signal CKIN (i.e. the clock gating cell 40B is disabled by the bit B0 of the control signal S11B), as shown in FIG. 6B. The multiplexer 21A is controlled by the bit B2 (B2=0) of the control signal S11A to transmit the output clock signal CKOUTA, which is delayed by the delay path P120A, from the input terminal T24A to the output terminal T26A to serve as the delay clock signal CKDLYA. The multiplexer 21B is controlled by the bit B2 (B2=1) of the control signal S11B to transmit the output clock signal CKOUTB, which is delayed by the delay path P121B, from the input terminal T25B to the output terminal T26B to serve as the delay clock signal CKDLYB.

Figure 6C:
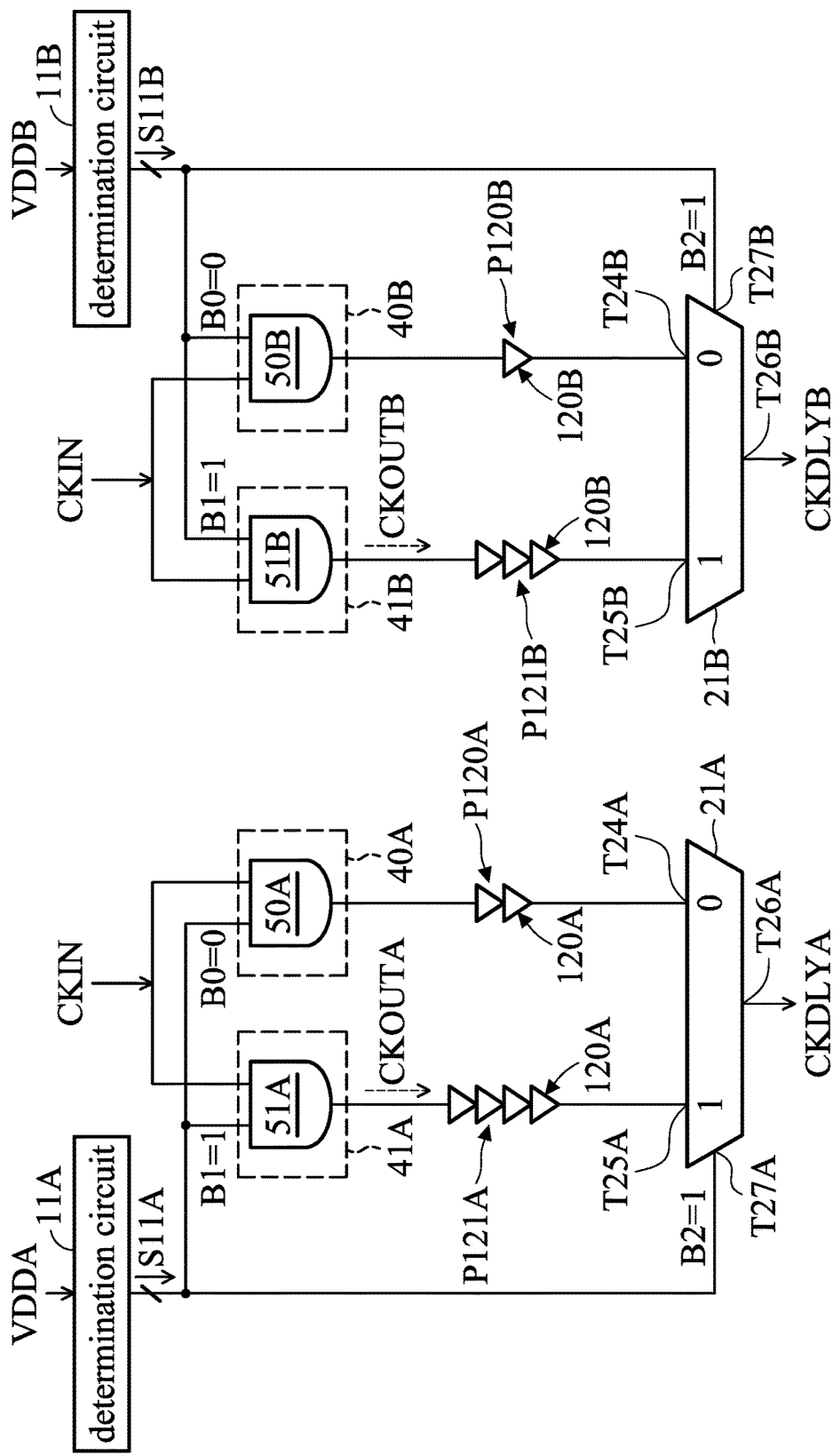

In third case, the power mode control circuit 10 may generate a voltage with a relatively high level to the function circuit 13A and a voltage with a relatively high level to the function circuit 13B. The function circuit 13A may operate at a high speed with less clock latency, while the function circuit 13B may operate at a high speed with less clock latency. Referring to FIG. 6C, at this time, the determination circuit 11A generates the control signal S11A with "011" (B0=0, B1=1, B2=1), and the determination circuit 11B generates the control signal S11B with "011" (B0=0, B1=1, B2=1). According to the operations of the clock gating cells 40A and 41A, the AND gate 51A generates the output clock signal CKOUTA to the delay path P121A (that is the clock gating cell 41A is enabled by the bit B1 of the control signal S11A) and the output clock signal CKOUTA is delayed by the delay path P121A with the longer delay time, while the AND gate 50A does not generate the output clock signal CKOUTA or any clock signal derived from the input clock signal CKIN (that is the clock gating cell 40A is disabled by the bit B0 of the control signal S11A), as shown in FIG. 6C. According to the operations of the clock gating cells 40B and 41B, the AND gate 51B generates the output clock signal CKOUTB to the delay path P121B (that is the clock gating cell 41B is enabled by the bit B1 of the control signal S11B) and the output clock signal CKOUTB is delayed by the delay path P121B with the longer delay time, while the AND gate 50B does not generate the output clock signal CKOUTB or any clock signal derived from the input clock signal CKIN (that is the clock gating cell 40B is disabled by the bit B0 of the control signal S11B), as shown in FIG. 6C. The multiplexer 21A is controlled by the bit B2 (B2=1) of the control signal S11A to transmit the output clock signal CKOUTA, which is delayed by the delay path P121A, from the input terminal T25A to the output terminal T26A to serve as the delay clock signal CKDLYA. The multiplexer 21B is controlled by the bit B2 (B2=1) of the control signal S11B to transmit the output clock signal CKOUTB, which is delayed by the delay path P121B, from the input terminal T25B to the output terminal T26B to serve as the delay clock signal CKDLYB.

Figure 6D:
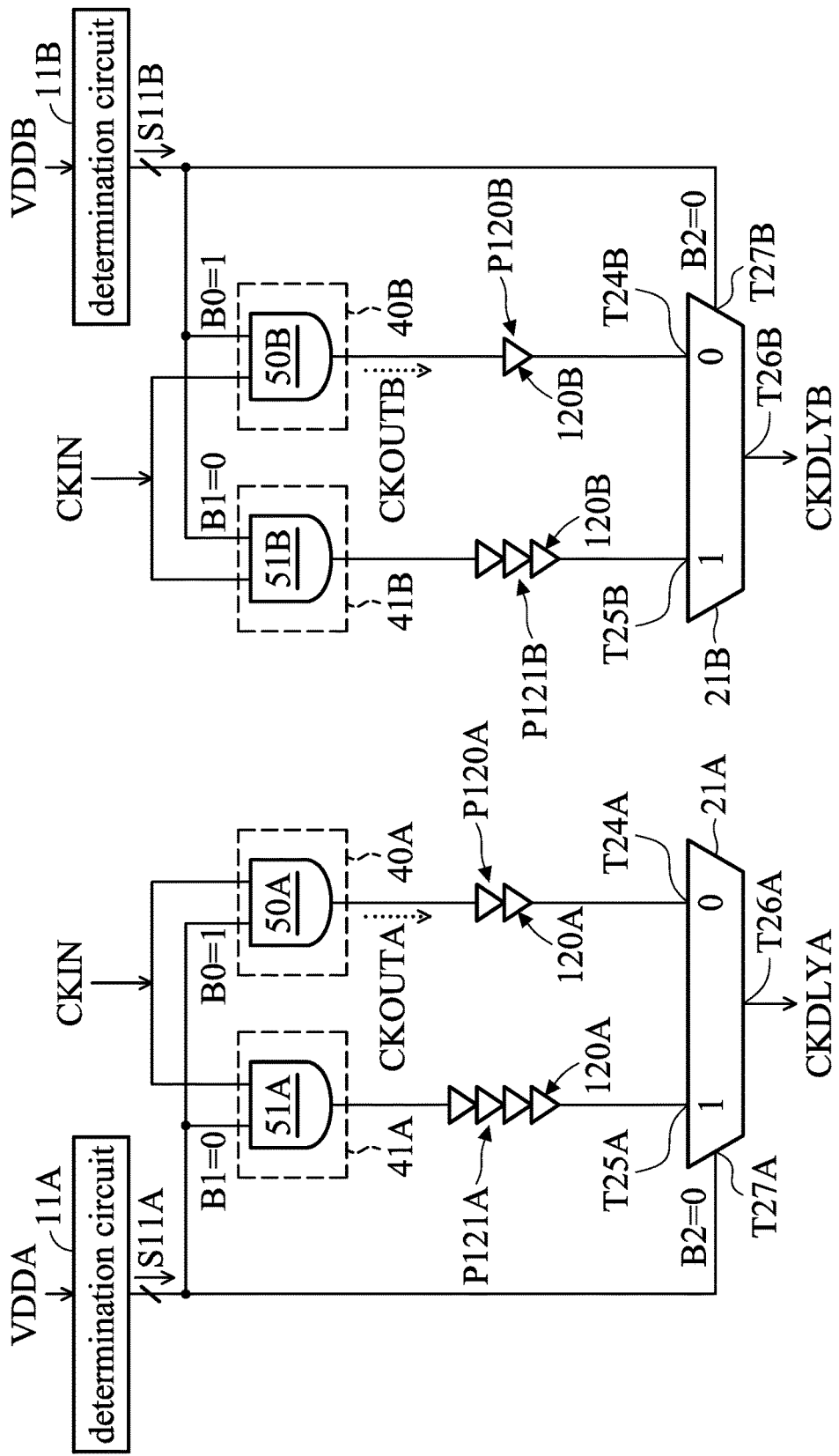

In fourth case, the power mode control circuit 10 may generate a voltage with a relatively low level to the function circuit 13A and a voltage with a relatively low level to the function circuit 13B. The function circuit 13A may operate at a low speed with greater clock latency, while the function circuit 13B may operate at a low speed with greater clock latency. Referring to FIG. 6D, at this time, the determination circuit 11A generates the control signal S11A with "100" (B0=1, B1=0, B2=0), while the determination circuit 11B generates the control signal S11B with "100" (B0=1, B1=0, B2=0). According to the operations of the clock gating cells 40A and 41A, the AND gate 50A generates the output clock signal CKOUTA to the delay path P120A (that is the clock gating cell 40A is enabled by the bit B0 of the control signal S11A) and the output clock signal CKOUTA is delayed by the delay path P120A with the shorter delay time, while the AND gate 51A does not generate the output clock signal CKOUTA or any clock signal derived from the input clock signal CKIN (that is the clock gating cell 41A is disabled by the bit B1 of the control signal S11A), as shown in FIG. 6D. According to the operations of the clock gating cells 40B and 41B, the AND gate 50B generates the output clock signal CKOUTB to the delay path P120B (that is the clock gating cell 40B is enabled by the bit B0 of the control signal S11B) and the output clock signal CKOUTB is delayed by the delay path P120B with the shorter delay time, while the AND gate 51B does not generate the output clock signal CKOUTB or any clock signal derived from the input clock signal CKIN (that is the clock gating cell 41B is disabled by the bit B1 of the control signal S11B), as shown FIG. 6D. The multiplexer 21A is controlled by the bit B2 (B2=0) of the control signal S11A to transmit the output clock signal CKOUTA, which is delayed by the delay path P120A, from the input terminal T24A to the output terminal T26A to serve as the delay clock signal CKDLYA. The multiplexer 21B is controlled by the bit B2 (B2=0) of the control signal S11B to transmit the output clock signal CKOUTB, which is delayed by the delay path P120B, from the input terminal T24B to the output terminal T26B to serve as the delay clock signal CKDLYB.

Figure 7:
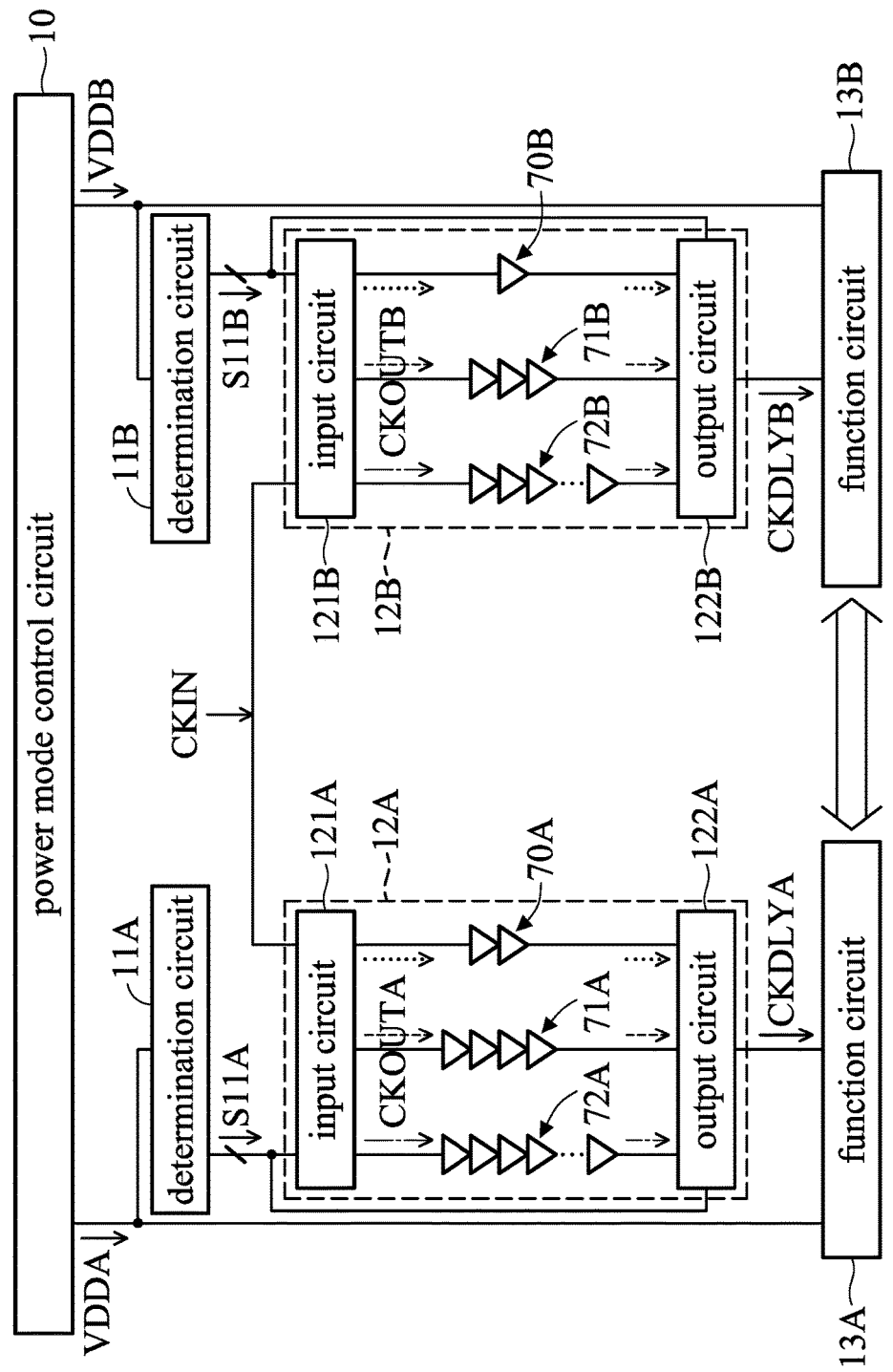
FIG. 7 shows one exemplary embodiment of an integrated circuit with multi-voltage design.

In the above embodiments, two delay paths in one clock buffer circuit are given as an example. In other embodiments, for minimizing the timing variation in the data transmission between the function circuits 13A and 13B, at least one clock buffer circuit may comprise more than two delay paths, such as three delay paths. As shown in FIG. 7, the clock buffer circuit 12A comprises three delay paths 70A, 71A, and 72A, and the clock buffer circuit 12B comprises three delay paths 70B, 71B, and 72B. For example, the input circuit 121A is controlled by the corresponding determination circuit 11A to generate the output clock signal CKOUTA to one of the three delay paths 70A, 71A, and 72A and block the input clock signal CKIN or any clock signal derived from the input clock signal CKIN (such as the output clock signal CKOUTA) from being provided to the other two delay paths. Accordingly, the power consumption of the clock buffer circuits 120A and 120B can be decreased. The integrated circuit shown in FIG. 7 operates based on the principle, operations, and circuit structures described in the above embodiment. Thus, the related description is omitted.

Figure 8:
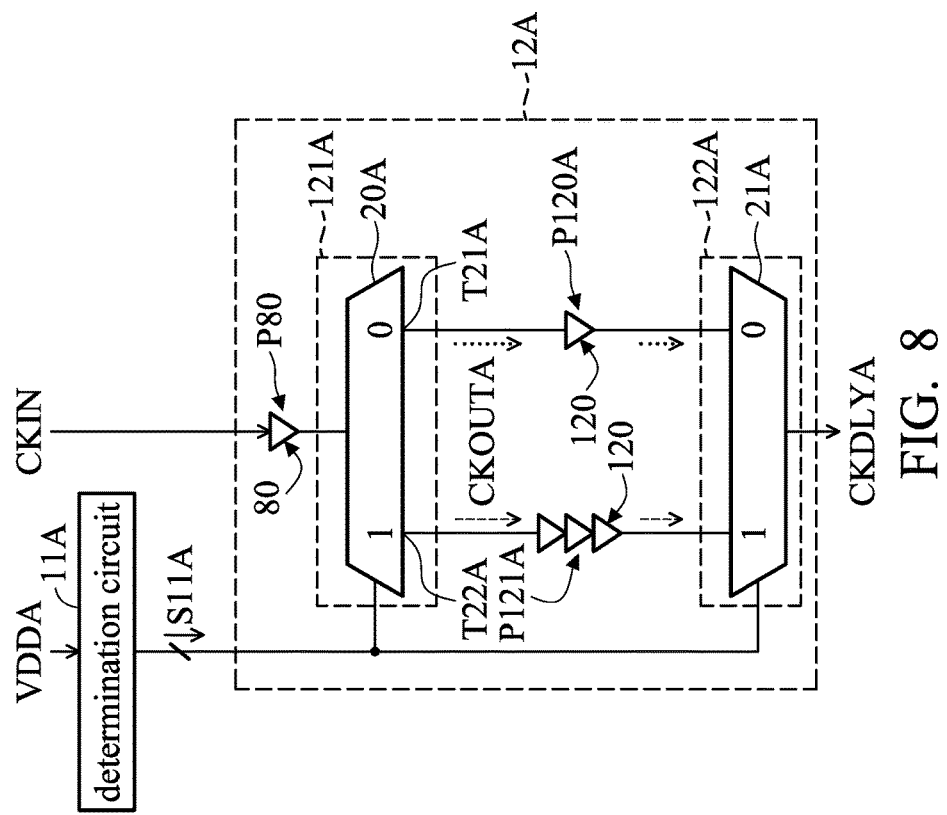
FIG. 8 shows another exemplary embodiment of clock buffer circuits.

In another embodiment, there is a least one buffer shared by the delay paths of one clock buffer circuit. As shown in FIG. 1, the delay path P120A comprises two buffers 120A, and the delay path P121A comprises four buffers 120A. Thus, the delay paths P120A and P121A may share one buffer. As shown in FIG. 8, there is an additional delay path P80. The delay path P80 receives the input clock signal CKIN and delays the input clock signal CKIN. The delayed input clock signal CKIN is transmitted to the input circuit 121A for the further delay operation. Accordingly, the number of buffers in the clock buffer circuit 12A can be decreased. For example, compared with the clock buffer circuit 12A in FIGS. 1-6D, the number of buffers in the clock buffer circuit 12A in FIG. 8 is decreased from 6 to 5.

In the above embodiments, the number of buffers of the delay path P80, the number of buffers of the delay path P120A, and the number of buffers of the delay path P121A are examples for illustration without limitations. These can be determined according to the system requirement and circuit design.

Figure 9:
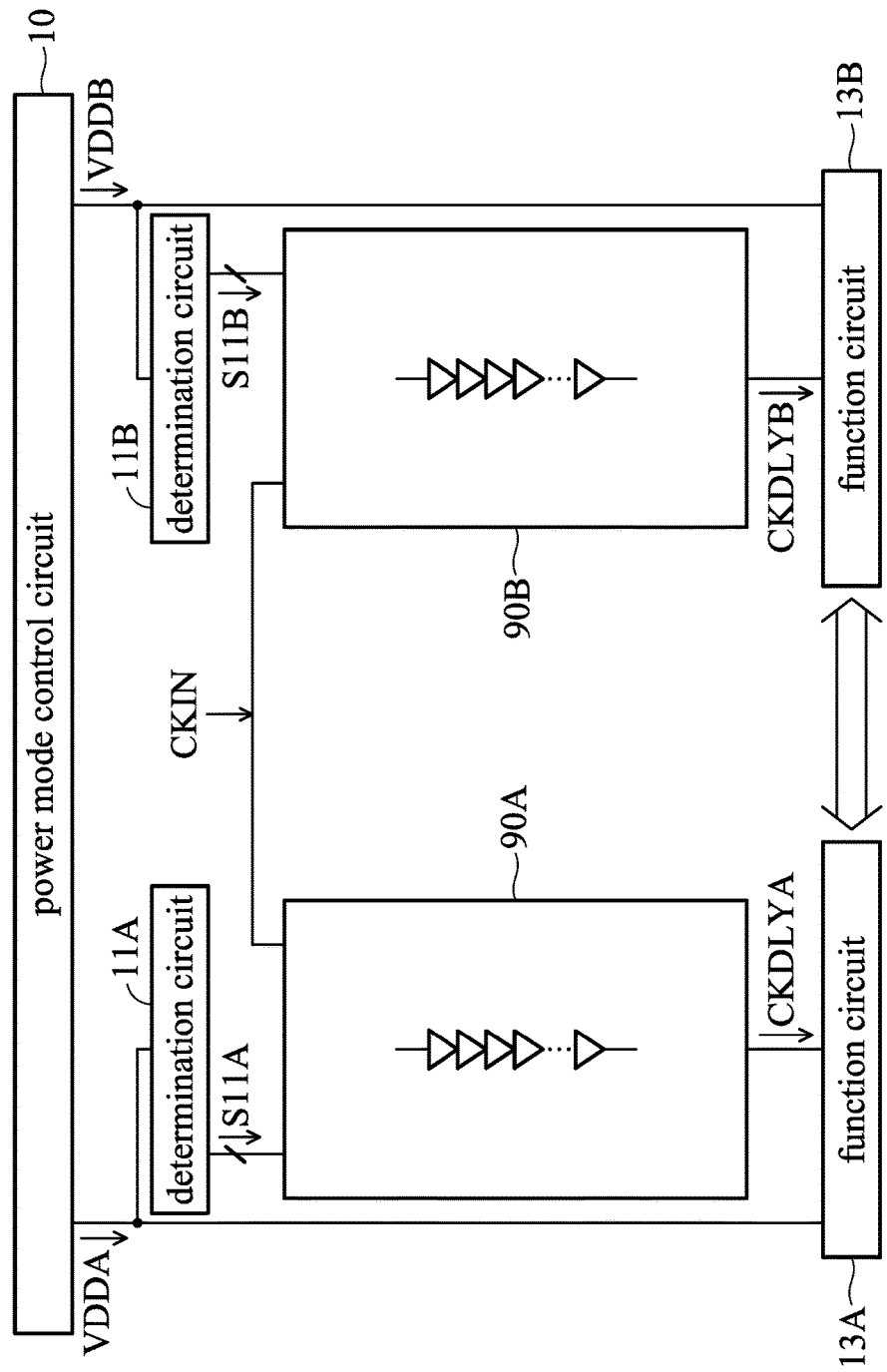
FIG. 9 shows another exemplary embodiment of an integrated circuit with multi-voltage design.

FIG. 9 shows yet another embodiment of the clock buffer circuits. In the embodiment, controlled delay circuits 90A and 90B generate delay clock signals to the function circuit 13A and 13B respectively. Each of the controlled delay circuits 90A and 90B has a variable delay time which is determined by the corresponding control signal from the determination circuit. For example, the variable delay time of the controlled delay circuit 90A is determined by the control signal S11A, so that the controlled delay circuit 90A generates the delay clock signal CKDLYA according to the determined delay time. Similarly, the variable delay time of the controlled delay circuit 90B is determined by the control signal S11B, so that the controlled delay circuit 90B generates the delay clock signal CKDLYB according to the determined delay time.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An integrated circuit comprising:
    a control circuit generating a first operation voltage;
    a first function circuit supplied by the first operation voltage and operating based on a first delay clock signal;
    a first determination circuit receiving the first operation voltage and generating a first control signal according to the first operation voltage; and
    a first controllable delay circuit configured to receive an input clock signal to generate the first delay clock signal with a first variable delay time according to the first control signal,
    wherein the first controllable delay circuit comprises:
    a first input circuit receiving the input clock signal and generating a first output clock signal according to the input clock signal;
    a first delay path, coupled between the first input circuit and the first function circuit, having a first delay time; and
    a second delay path, coupled between the first input circuit and the first function circuit, having a second delay time which is longer than the first delay time,
    wherein the first input circuit selectively provides the first output clock signal to a first specific delay path among the first and second delay paths according to the first control signal for generating the first delay clock signal.

2. The integrated circuit as claimed in claim 1, wherein the first controllable delay circuit further comprises:
    a first output circuit generating the first delay clock signal derived from the first output clock signal,
    wherein the first output circuit receives the first output clock signal which passes through the first specific delay path and outputs the first delay clock signal to the first function circuit.

3. The integrated circuit as claimed in claim 2,
    wherein when the first determination circuit detects that the first operation voltage is at a first voltage level, the first delay path serves as the first specific delay path and delays the first input clock signal by the first delay time,
    wherein when the first determination circuit detects that the first operation voltage is at a second voltage level which is higher than the first voltage level, the second delay path serves as the first specific delay path and delays the first input clock signal by the second delay time.

4. The integrated circuit as claimed in claim 3,
    wherein when the first determination circuit detects that the first operation voltage is at the first voltage level, the first input circuit blocks the input clock signal or any clock signal derived from the input clock signal from being provided to the second delay path according to the first control signal, and
    wherein when the first determination circuit detects that the first operation voltage is at the second voltage level, the first input circuit blocks the input clock signal or any clock signal derived from the input clock signal from being provided to the first delay path according to the first control signal.

5. The integrated circuit as claimed in claim 2, wherein the first input circuit comprises:
    a demultiplexer having an input terminal receiving the input clock signal and further having a first output terminal coupled to the first delay path and a second output terminal coupled to the second delay path,
    wherein the demultiplexer is controlled by the first control signal to transmit the input clock signal from the input terminal to one of the first and second output terminals to serve as the first output clock signal, and the one of the first and second output terminal is coupled to the first specific delay path.

6. The integrated circuit as claimed in claim 2, wherein the first input circuit comprises:
    a first clock gating cell coupled to the first delay path and controlled by the first control signal; and
    a second clock gating cell coupled to the second delay path and controlled by the first control signal,
    wherein the first and second clock gating cells receive the input clock signal, and
    wherein one of the first and second clock gating cell is coupled to the first specific delay path, and the one of the first and second gating cells is enabled by the first control signal to generate the first output clock signal according to the input clock signal.

7. The integrated circuit as claimed in claim 6,
    wherein the first control signal is a digital signal with a plurality of bits, and
    wherein the first clock gating cell comprises a first AND gate which receives the input clock signal and a first bit of the first control signal, and the second clock gating cell comprises a second AND gate which receives the input clock signal and a second bit of the first control signal.

8. The integrated circuit as claimed in claim 2 further comprising:
    a third delay path, coupled to the first input circuit, receiving the input clock signal and delaying the input clock signal,
    wherein the first input circuit receives the input clock signal which passes through the third delay path.

9. The integrated circuit as claimed in claim 2, wherein the first output circuit comprises:
    a multiplexer having a first input coupled to the first delay path and a second input coupled to the second delay path and further having an output terminal,
    wherein the multiplexer is controlled by the control signal to transmit the input clock signal passing through the specific delay path to the output terminal to serve as the delay clock signal.

10. The integrated circuit as claimed in claim 1, wherein the control circuit further generates a second operation voltage, and the integrated circuit further comprises:
    a second controllable delay circuit configured to receive the input clock signal to generate a second delay clock signal with a second variable delay time according to a second control signal.

11. The integrated circuit as claimed in claim 10 further comprising:
- a second function circuit supplied by the second operation voltage and operating based on the second delay clock signal; and
- a second determination circuit receiving the second operation voltage and generating the second control signal according to the second operation voltage;

wherein the second controllable delay circuit comprises:
- a second input circuit receiving the input clock signal and generating a second output clock signal according to the input clock signal;
- a second output circuit generating the second delay clock signal derived from the second output clock signal;
- a third delay path, coupled between the second input circuit and the second output circuit, having a third delay time; and
- a fourth delay path coupled between the second input circuit and the second output circuit, having a fourth delay time which is longer than the third delay time, wherein the second input circuit selectively provides the second output clock signal to a second specific delay path among the third and fourth delay paths according to the second control signal, and wherein the second output circuit receives the second output clock signal which passes through the second specific delay path and outputs the second delay clock signal to the second function circuit.

12. The integrated circuit as claimed in claim 11, wherein when the second determination circuit detects that the second operation voltage is at a third voltage level, the third delay path serves as the second specific delay path and delays the second input clock signal by the third delay time, wherein when the second determination circuit detects that the second operation voltage is at a fourth voltage level which is higher than the third voltage level, the fourth delay path serves as the second specific delay path and delays the second input clock signal by the fourth delay time.

* * * * *